(12) United States Patent
Westra et al.

(10) Patent No.: US 9,543,752 B2
(45) Date of Patent: Jan. 10, 2017

(54) OVERVOLTAGE PROTECTION CIRCUIT WITH DIGITAL CONTROL

(71) Applicant: BROADCOM CORPORATION, Irvine, CA (US)

(72) Inventors: Jan Roelof Westra, Uithoorn (NL); Jan Mulder, Houten (NL); Qiongna Zhang, Houten (NL); Jeffrey Allan Riley, Utrecht (NL); Davide Vecchi, Utrecht (NL)

(73) Assignee: Broadcom Corporation, Irvine, CA (US)

( * ) Notice: Subject to any disclaimer, the term of this patent is extended or adjusted under 35 U.S.C. 154(b) by 431 days.

(21) Appl. No.: 14/042,436

(22) Filed: Sep. 30, 2013

(65) Prior Publication Data

US 2015/0085412 A1 Mar. 26, 2015

Related U.S. Application Data

(60) Provisional application No. 61/881,910, filed on Sep. 24, 2013.

(51) Int. Cl.
| | |
|---|---|
| H02H 3/20 | (2006.01) |
| H01L 23/60 | (2006.01) |
| H01L 27/02 | (2006.01) |
| H01Q 1/50 | (2006.01) |

(52) U.S. Cl.
CPC ............... H02H 3/20 (2013.01); H01L 23/60 (2013.01); H01L 27/0248 (2013.01); H01Q 1/50 (2013.01)

(58) Field of Classification Search
CPC ............ H02H 3/20; H02H 3/025; H02H 3/07; H01P 1/10; H01P 1/15; H01Q 1/50; H01L 23/60; H01L 27/0248
USPC ......................................................... 361/91.1
See application file for complete search history.

(56) References Cited

U.S. PATENT DOCUMENTS

| | | | | |
|---|---|---|---|---|
| 5,943,203 | A * | 8/1999 | Wang | H02H 3/07 361/103 |
| 6,195,535 | B1 * | 2/2001 | Kurchuk | H04B 1/48 455/217 |
| 2005/0269992 | A1 * | 12/2005 | Lai | H02J 7/0031 320/134 |
| 2014/0152114 | A1 * | 6/2014 | Kim | H04B 5/0093 307/104 |

* cited by examiner

*Primary Examiner* — Stephen W Jackson
*Assistant Examiner* — Christopher Clark
(74) *Attorney, Agent, or Firm* — McDermott Will & Emery LLP

(57) ABSTRACT

A device for digitally protecting against an overvoltage event may include a front-end circuit, an overvoltage protection circuit, and a protection switch. The protection switch may be coupled to the overvoltage protection circuit and may be configured to decouple the front-end circuit from an external medium, in response to a clamp signal. The overvoltage protection circuit may be configured to detect the overvoltage event at one or more nodes of a circuit. In response to the detection of the overvoltage event, the overvoltage protection circuit may generate the clamp signal to activate the protection switch.

20 Claims, 6 Drawing Sheets

OVERVOLTAGE PROTECTION CIRCUIT WITH DIGITAL CONTROL

CROSS-REFERENCE TO RELATED APPLICATIONS

This application claims the benefit of priority under 35 U.S.C. §119 from U.S. Provisional Patent Application 61/881,910 filed Sep. 24, 2013, which is incorporated herein by reference in its entirety.

TECHNICAL FIELD

The present description relates generally to protection circuits, and more particularly, but not exclusively, to overvoltage protection circuit with digital control.

BACKGROUND

Many electronic circuits, in particular, any circuit that is coupled to a medium such as an antenna or cable may need some kind of protection against overvoltage events. Such overvoltage events may be induced by external sources such as external electromagnetic fields, high output-power transmitters on the same media, and/or lightning events, the effects of which may reach the electronic circuit through the medium coupled to the circuit. Internally induced overvoltage may result from system transients, in particular, during mode transitions such as power-up, power-down and other transitions, and/or temporary excessive gain setting of one or more programmable gain stages that can cause overvoltage at their output nodes or other nodes of the circuit.

Existing overvoltage protection circuits may use antiparallel diodes that can cause non-linearity in the signal path and may not be able to sense the overvoltage at other nodes of the circuit other than the node that is protected. Further, the existing overvoltage protection schemes may be incapable of protection against internally-induced overvoltage events and may lack features such as status reporting and programmability for being activated prior to an overvoltage event or for resetting at desired times.

BRIEF DESCRIPTION OF THE DRAWINGS

Certain features of the subject technology are set forth in the appended claims. However, for purpose of explanation, several embodiments of the subject technology are set forth in the following figures.

DETAILED DESCRIPTION

The detailed description set forth below is intended as a description of various configurations of the subject technology and is not intended to represent the only configurations in which the subject technology may be practiced. The appended drawings are incorporated herein and constitute a part of the detailed description. The detailed description includes specific details for the purpose of providing a thorough understanding of the subject technology. However, it will be clear and apparent to those skilled in the art that the subject technology is not limited to the specific details set forth herein and may be practiced using one or more implementations. In one or more instances, well-known structures and components are shown in block diagram form in order to avoid obscuring the concepts of the subject technology.

The subject technology is directed to a method and a device for digitally controlled overvoltage protection. An overvoltage protection device of the subject technology may protect a circuit against both externally and internally induced overvoltage events. The disclosed overvoltage protection device may be configured to monitor a number of nodes of the circuit for overvoltage events, to respond quickly, and to report status to a digital control system, and to activate a protection switch. The disclosed solution benefits from an improved linearity and enables low-power operation of the protected circuit, as the protected circuit can be implemented with thin-oxide transistors rather than the thick-oxide transistors, which can consume more power for the same performance. The subject technology can be readily implemented with digital circuitry and is highly flexible, has a quick response, and does not result in bit errors or a loss of communication link.

Figure 1:
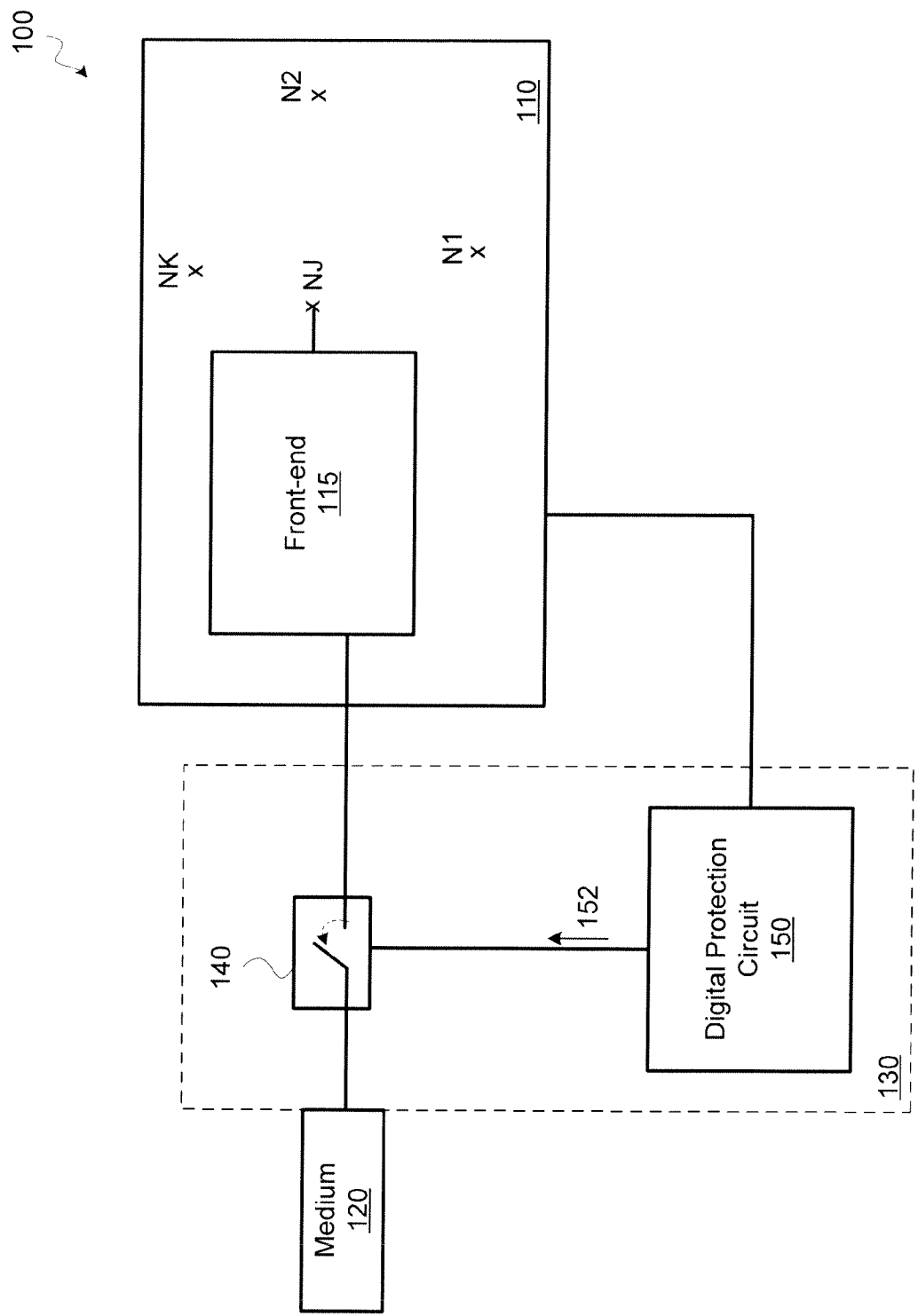
FIG. 1 illustrates a high-level diagram of an example of an apparatus with overvoltage protection using digital control in accordance with one or more implementations.

FIG. 1 illustrates a high-level diagram of an example of an apparatus 100 with overvoltage protection using digital control in accordance with one or more implementations of the subject technology. The apparatus 100 may include a circuit 110 coupled to an external medium 120 through a front-end circuit 115 and an overvoltage protection circuit 130. Examples of the external medium 120 may include a radio-frequency (RF) antenna, a cable, a satellite antenna/dish, and other types of external media. The overvoltage protection circuit 130 may include a digital protection circuit 150 and a protection switch 140. The protection switch 140 is closed in normal operation, and can be opened in response to a switch signal (hereinafter also referred to as "clamp signal") 152 from the digital protection circuit 130. In some aspects, the protection switch 140 may be implemented with a thick-oxide transistor and be driven from a higher voltage (e.g. I/O) supply. The digital protection circuit 150 (hereinafter "protection circuit 150") may be coupled to the protection switch 140, and can control the switch 140 through the switch signal 152. The protection switch may be configured to decouple the front-end circuit 115 from the external medium 120, in response to the clamp signal 152.

In one or more implementations of the subject technology, the protection circuit 150 may be configured to detect one or more overvoltage events at one or more nodes (e.g., N1, N2 . . . NK) of the circuit 110, one of which (e.g., NJ) may be at the output of the front-end circuit 115. In response to the detection of an overvoltage event, the protection circuit 150 may generate the clamp signal 152 to activate the protection switch 140 to decouple the circuit 110 from the medium 120 in order to protect the circuit 110 against the overvoltage (e.g., an externally induced overvoltage). The protection circuit 150 may be digitally controllable by a digital control circuit, as discussed in more detail herein.

Figure 2:
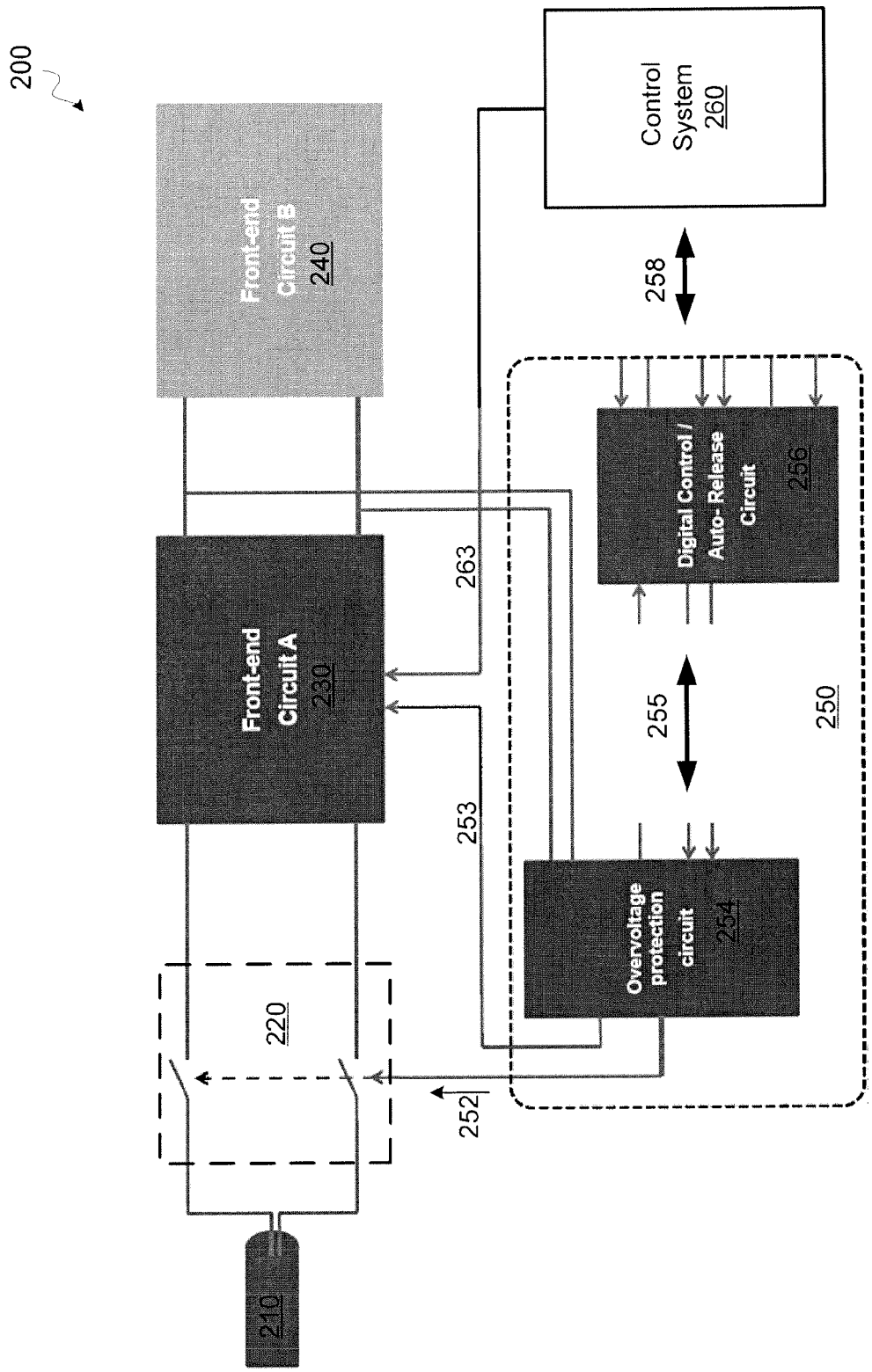
FIG. 2 illustrates an example of an apparatus for overvoltage protection with digital control in accordance with one or more implementations.

FIG. 2 illustrates an example of an apparatus 200 for overvoltage protection with digital control in accordance with one or more implementations of the subject technology.

The apparatus 200 includes a protection circuit 250 coupled to a protection switch 220 and a front-end circuit 230, and the front-end circuit 240. The protection circuit 250 can be controlled by a control system 260 (e.g., a processor, a digital core, or a controller). The switch 220 may be operable to decouple the front-end circuit 230 from a medium 210 (e.g., a cable or an antenna such as an RF or satellite antenna), in response to a clamp signal 252 from the protection circuit 250. In some aspects the protection circuit 250 may control (e.g., reduce to a lowest value) a gain of the front-end circuit 230 by issuing a gain-control signal 253. The gain of the front-end circuit 230 may be regularly controlled by a gain-control signal 263 issued by the digital control system 260 (hereinafter "control system 260").

The protection circuit 250 may include an overvoltage protection circuit (herein after "overvoltage circuit") 254 and a digital control/auto-release circuit (herein after "digital control circuit") 256. The overvoltage circuit 254 may detect one or more overvoltage events at the output nodes of the front-end circuit 230 or other nodes of a circuit that is to be protected. In response to the detection of the overvoltage event, the overvoltage circuit 254 may send the clamp signal 252 to the protection switch 220 to activate the switch to decouple the front-end circuit 230 from the medium 210, and/or issue the gain control signal 253. The overvoltage circuit 254 may communicate a number of signals 255 with the digital control circuit 256.

In one or more aspects, the digital control circuit 256 may generate and communicate one or more protect signals to the overvoltage circuit 254. The overvoltage circuit 254 may in turn issue a clamp status signal to the digital control circuit 256. The digital control circuit 256 may communicate a number of signals 258 with the control system 260. The signals 258 may correspond to information requests, information deliveries, sending protect status signals, and receiving protect-set and protect-reset signals, configuration signals, and/or control signals.

Figure 3:
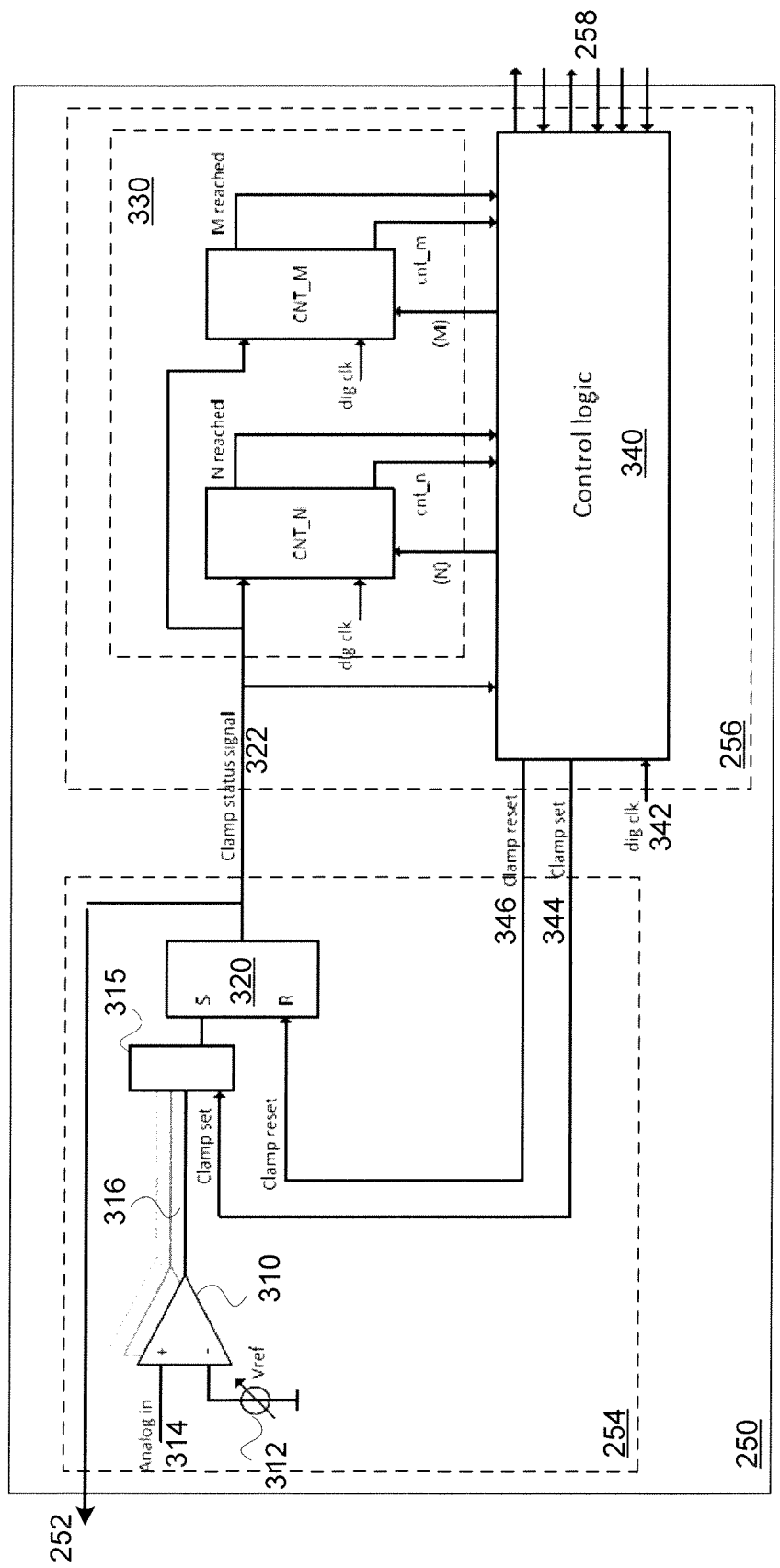
FIG. 3 illustrates an example of an implementation of the digital protection circuit of FIG. 2 in accordance with one or more implementations.

FIG. 3 illustrates an example of an implementation of the digital protection circuit 250 of FIG. 2 in accordance with one or more implementations of the subject technology. The digital protection circuit 250 includes the overvoltage circuit 254 and the digital control circuit 256. The overvoltage circuit 254 includes one or more comparators 310, a logic circuit 315, and a latch circuit 320. Each comparator 310 may compare an analog signal 314 (e.g., a sensed node voltage) with a reference voltage 312 (e.g. a set overvoltage threshold) and generate an output signal 316 when the analog signal 314 exceeds the reference voltage 312. The analog signal 314 may be derived from sensing voltages at one or more nodes of a circuit (e.g., nodes N1, N2 . . . NK of circuit 110 of FIG. 1). The reference voltage 312 may be configured based on a desired threshold for the overvoltage and may depend on the circuit (e.g., circuit 110) that is being protected. In other words, an assertion of the output signal 316 is an indication of an overvoltage event that was sensed at a node of the circuit 110. The logic circuit 315 may set the latch circuit 320 based on either the assertion of the output signal 316 or a clamp set signal 344 received from the digital control circuit 256.

The output of the latch circuit 320 can be used as the clamp signal 252 or the gain control signal 253 to activate the protection switch 220 of FIG. 2 or as the clamp status signal 322 provided to the digital control circuit 256. In some aspects, the latch circuit 320 can be reset by a reset clamp signal 346 received from the digital control circuit 256. In that case, the clamp signal 252 may deactivate the protection switch 220 and the clamp status signal 322 can report to the digital control circuit 256 that the clamp has been reset. In one or more implementations, the digital control circuit 256 may include a control logic circuit 340 and a counter circuit 330. The control logic circuit 340 may be responsible for generating the clamp set and clamp reset signals 344 and 346. The control logic circuit 340 may also perform communications (e.g., through signals 258) with the control system 260 of FIG. 2. In some aspects, the control logic circuit 340 may receive, from the control system 260, information requests, the protect-set signal, the protect reset signal, the configuration signals, and/or a control signals. The control logic circuit 340 may deliver to control system 260 the information requested by the control system 260 and protect status signal 322, which can be received from the latch circuit 320.

In one or more aspects, the clamp signal 252 may be asserted for a predefined number of (e.g., N) clock cycles and the digital protection circuit 250 may be configured to notify the control system 260 after a predefined number of (e.g., M) assertions of the clamp signal 252. The counter circuit 330 (detail of which is known and is skipped herein for simplicity) can be configured to notify the control logic circuit 340 when the number of digital clock signals (e.g., 342) from the assertion point of the clamp signal 252 has reached the predefined number N. In response to this notification, the control logic circuit 340 can generate the clamp reset signal 346 that can in turn reset the latch circuit 320. The counter circuit 330 may also notify the control logic circuit 340 when the number of assertion of the clamp signal 252 has reached the predefined number M, the point at which the control logic circuit 340 can report to the control system 260 that clamp action (e.g., auto-release) has occurred M times. In one or more aspects, the control system 260 can poll the control logic circuit 340 to receive information such as the number of the protection events after the last reset.

Figure 4:
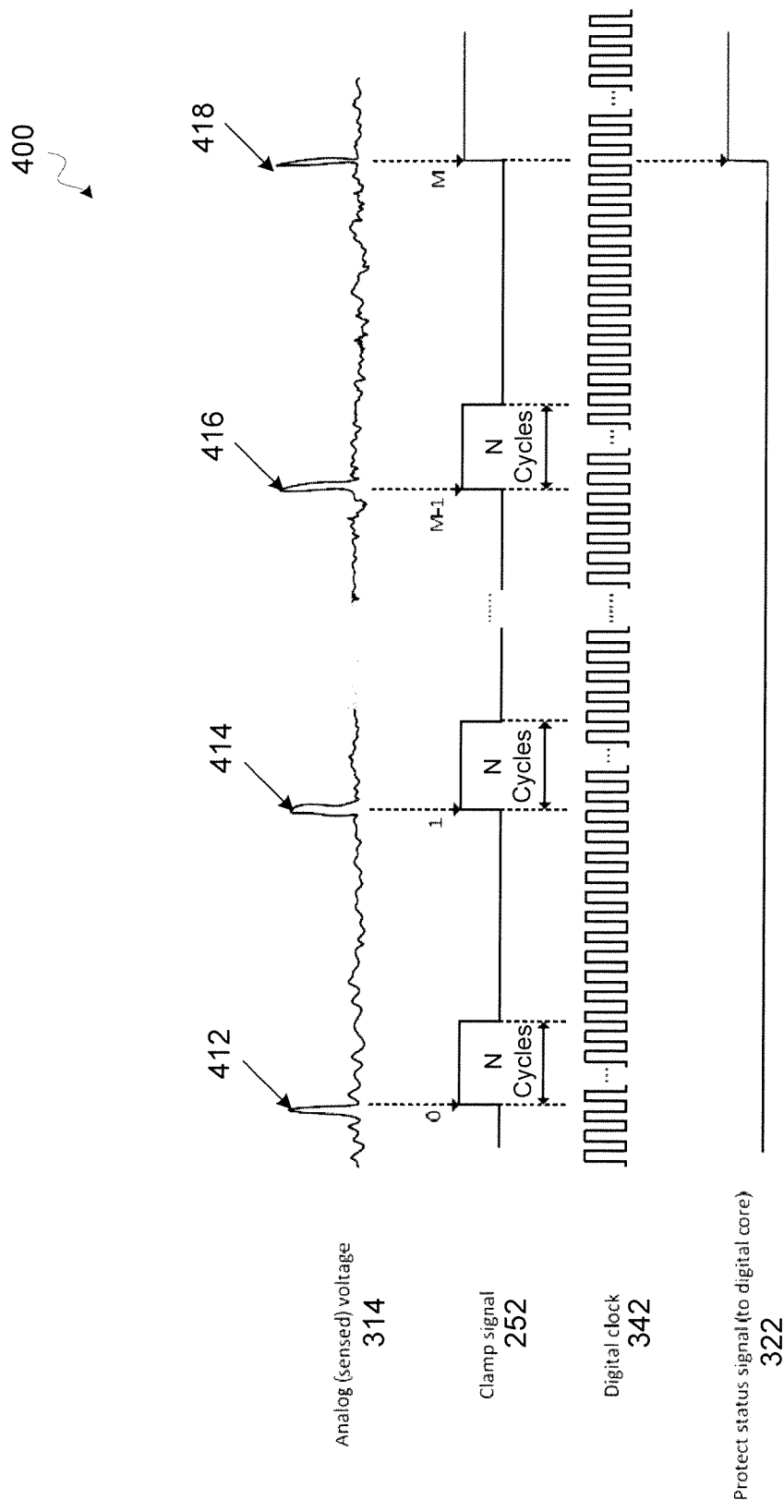
FIG. 4 illustrates a timing diagram showing various example signals of the digital protection circuit of FIG. 3 in accordance with one or more implementations.

FIG. 4 illustrates a timing diagram 400 showing examples of signals of the digital protection circuit of FIG. 3 accordance with one or more implementations of the subject technology. The signals shown in the timing diagram 400 include the analog signal 314, the clamp signal 252, the digital clock 342, and the clamp status (e.g., protect status) signal 322. The analog signal 314 is the sensed voltage signal at one or more nodes of the circuit 110 of FIG. 1, and may include overvoltage (higher than the set threshold) peaks 412, 414, 416, and 418, each of which can signify an overvoltage event. The clamp signal 252 may start approximately at the time of each peak and can last for N cycles of the digital clock signal 342. After M times assertion of the clamp signal 252 (e.g., at the rising edge of the Mth clamp signal), the clamp status signal 322 is asserted.

Figure 5:
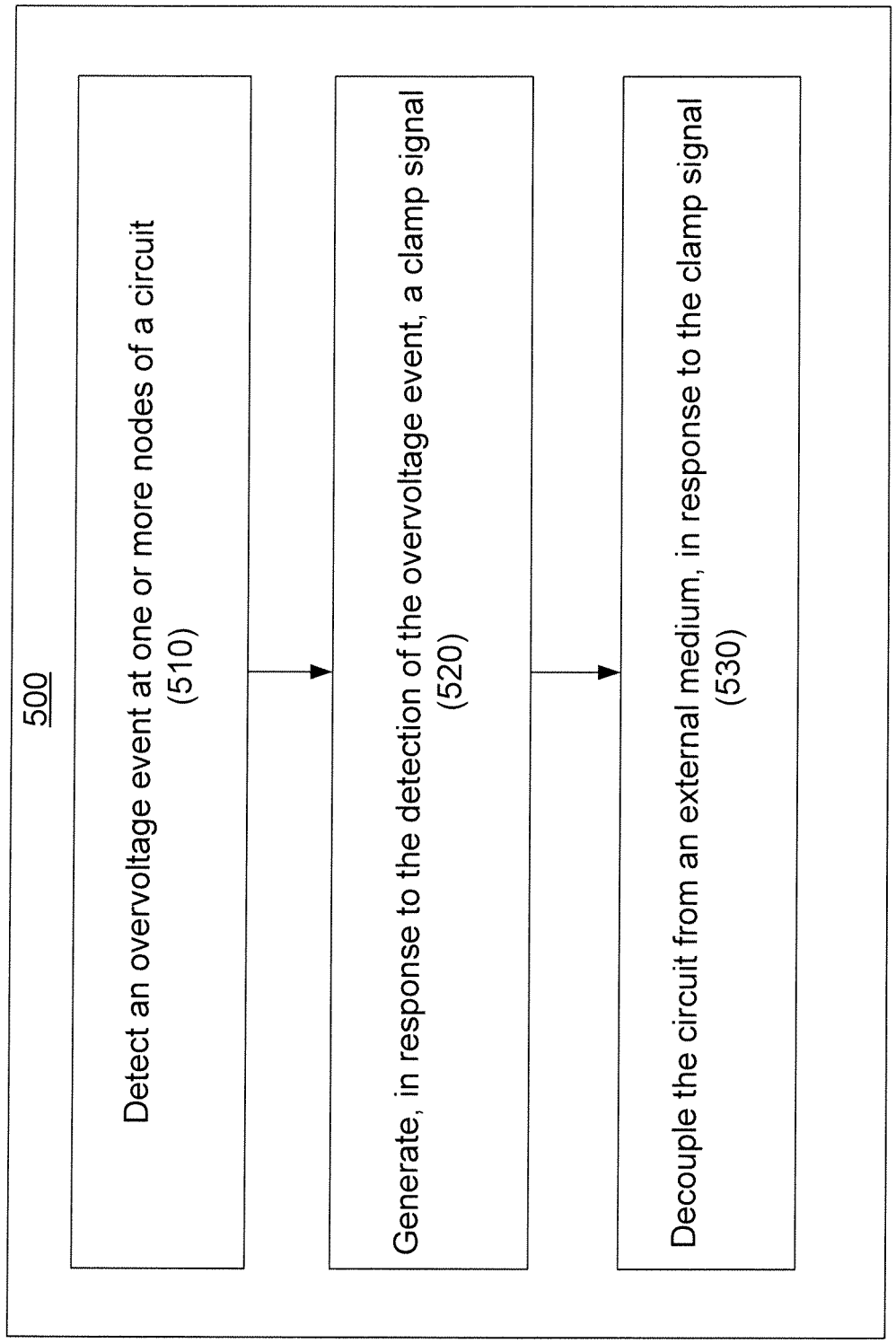
FIG. 5 illustrates an example method for providing overvoltage protection with digital control in accordance with one or more implementations.

FIG. 5 illustrates an example method 500 for providing overvoltage protection with digital control in accordance with one or more implementations of the subject technology. The steps of the method 500 do not need to be performed in the order shown and one or more steps may be omitted. An overvoltage event (e.g., signified by a peak such as 414 of FIG. 4) may be detected (e.g., by 150 of FIG. 1 or 250 of FIG. 2) at one or more nodes (e.g., N1, N2 . . . NK of FIG. 1) of a circuit (e.g., 110 of FIG. 1) (510). In response to the detection of the overvoltage event, a clamp signal (e.g., 152 of FIG. 1 or 252 of FIG. 2) may be generated (e.g., by 150 of FIG. 1 or 254 of FIG. 2) (520). The circuit may be decoupled (e.g., by 140 of FIG. 1 or 220 of FIG. 2) from an external medium (e.g., 210 of FIG. 2), in response to the clamp signal (530).

Figure 6:
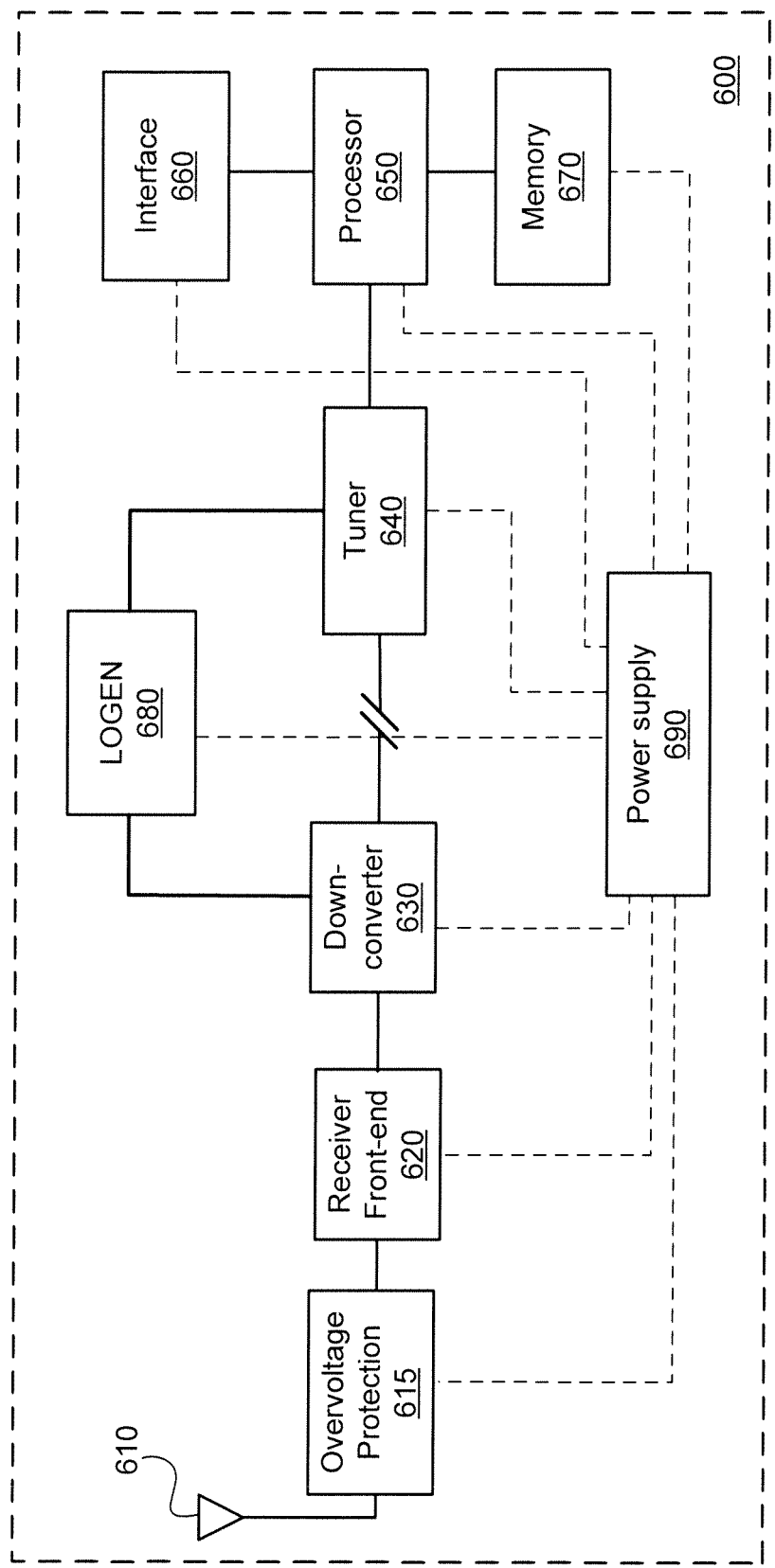
FIG. 6 illustrates an example communication device in accordance with one or more implementations.

FIG. 6 illustrates an example of a communication device 600, in accordance with one or more implementations of the subject technology. The communication device 600 may comprise a broadband communication device such as a satellite receiver. The communication device 600 may include a feed 610 coupled to a satellite antenna, a receiver front-end 620, a down-converter 630, a tuner 640, a processor 650, an interface 660, a memory 670, a local oscillator generator (LOGEN) 680, a power supply 690, and an overvoltage protection device 615. In various embodiments of the subject technology, the communication device 600 may include other modules or components not shown here for simplicity. One or more of the blocks represented in FIG. 6 may be integrated on one or more semiconductor substrates. For example, the blocks 615-680 may be realized in a single chip or a single system on chip, or may be realized in a multi-chip chipset.

The feed 610 may be suitable for receiving broadband signals (e.g., satellite signals) over a wide range of frequencies. Although a single feed 610 is illustrated, the subject technology is not so limited.

The down-converter 630 may comprise suitable logic, circuitry, interfaces, and/or code that can use local oscillator (LO) signals generated by the LO generator (LOGEN) 680 to down-convert the satellite signals (e.g., at 12 GHz) to radio-frequency (RF) signals (e.g., at 950-2150 MHz). The tuner 640 may comprise suitable logic, circuitry, interfaces, and/or code that can use proper LO signals generated by the LOGEN 680 to down-convert the RF signals and to generate baseband signals.

The processor 650 may comprise suitable logic, circuitry, and/or code that may enable processing data and/or controlling operations of the communication device 600. In this regard, the processor 650 may be enabled to provide control signals to various other portions of the communication device 600. The processor 650 may also control transfers of data between various portions of the communication device 600. Additionally, the processor 650 may enable implementation of an operating system or otherwise execute code to manage operations of the communication device 600.

In one or more implementations, the processor 650 may include/represent a baseband processor. The baseband processor may comprise suitable logic, circuitry, interfaces, and/or code that may be operable to perform processing of baseband signals. The baseband processor may, for example, analyze received signals and generate control and/or feedback signals for configuring various components of the communication device 600 such as the receiver front-end 620. The baseband processor may be operable to encode, decode, transcode, modulate, demodulate, encrypt, decrypt, scramble, descramble, and/or otherwise process data in accordance with one or more communications standards.

The memory 670 may comprise suitable logic, circuitry, and/or code that may enable storage of various types of information such as received data, generated data, code, and/or configuration information. The memory 670 may comprise, for example, RAM, ROM, flash, and/or magnetic storage. In various embodiment of the subject technology, Information stored in the memory 670 may be utilized for configuring the receiver front-end 620 and/or the processor 650.

The local oscillator generator (LOG EN) 680 may comprise suitable logic, circuitry, interfaces, and/or code that may be operable to generate one or more oscillating signals of one or more frequencies. The LOGEN 680 may be operable to generate digital and/or analog signals. In this manner, the LOGEN 680 may be operable to generate one or more clock signals and/or sinusoidal signals. Characteristics of the oscillating signals such as the frequency and duty cycle may be determined based on one or more control signals from, for example, the processor 650 and/or the processor 650. In operation, the processor 650 may configure the various components of the communication device 600 based on a communication standard according to which it is desired to receive signals. Broadband signals may be received via the feed 610 and amplified by the receiver front-end 620 and down-converted by the down-converter 630.

The baseband processing module may perform noise estimation and/or noise cancellation, decoding, and/or demodulation of the baseband signals. In this manner, information in the received signal may be recovered and utilized appropriately. For example, the information may be audio and/or video to be presented to a user of the communication device, data to be stored to the memory 670, and/or information affecting and/or enabling operation of the communication device 600. The baseband processing module 640 may modulate, encode and perform other processing on audio, video, and/or control signals to be processed by the interface device 660 and to be sent to a display device, such as TV set. The power supply 680 may provide one or more regulated rail voltages (e.g., $V_{DD}$) for various circuitries of the communication device 600.

In one or more implementations, the overvoltage protection device 615 may be similar to 130 of FIG. 1 or 200 of FIG. 2 and may be configured to use the processor 650 as the control system 260 of FIG. 2. The overvoltage protection device 615 may protect the communication device 600 against internally or externally induced overvoltage events. The overvoltage protection device 615 may, in response to detection of an overvoltage event, decouple the communication device 600 from the feed 610 and/or control a gain of the receiver front-end 620 to a desired level that can mitigate an internally induced overvoltage in the communication device 600.

Implementations within the scope of the present disclosure can be partially or entirely realized using a tangible computer-readable storage medium (or multiple tangible computer-readable storage media of one or more types) encoding one or more instructions. The tangible computer-readable storage medium also can be non-transitory in nature.

The computer-readable storage medium can be any storage medium that can be read, written, or otherwise accessed by a general purpose or special purpose computing device, including any processing electronics and/or processing circuitry capable of executing instructions. For example, without limitation, the computer-readable medium can include any volatile semiconductor memory, such as RAM, DRAM, SRAM, T-RAM, Z-RAM, and TTRAM. The computer-readable medium also can include any non-volatile semiconductor memory, such as ROM, PROM, EPROM, EEPROM, NVRAM, flash, nvSRAM, FeRAM, FeTRAM, MRAM, PRAM, CBRAM, SONOS, RRAM, NRAM, racetrack memory, FJG, and Millipede memory.

Further, the computer-readable storage medium can include any non-semiconductor memory, such as optical disk storage, magnetic disk storage, magnetic tape, other magnetic storage devices, or any other medium capable of storing one or more instructions. In some implementations, the tangible computer-readable storage medium can be directly coupled to a computing device, while in other implementations, the tangible computer-readable storage medium can be indirectly coupled to a computing device, e.g., via one or more wired connections, one or more wireless connections, or any combination thereof.

Instructions can be directly executable or can be used to develop executable instructions. For example, instructions can be realized as executable or non-executable machine code or as instructions in a high-level language that can be compiled to produce executable or non-executable machine code. Further, instructions also can be realized as or can include data. Computer-executable instructions also can be organized in any format, including routines, subroutines, programs, data structures, objects, modules, applications, applets, functions, etc. As recognized by those of skill in the art, details including, but not limited to, the number, structure, sequence, and organization of instructions can vary significantly without varying the underlying logic, function, processing, and output.

Those of skill in the art would appreciate that the various illustrative blocks, modules, elements, components, and methods described herein may be implemented as electronic hardware, computer software, or combinations of both. To illustrate this interchangeability of hardware and software, various illustrative blocks, modules, elements, components, and methods have been described above generally in terms of their functionality. Whether such functionality is implemented as hardware or software depends upon the particular application and design constraints imposed on the overall system. Skilled artisans may implement the described functionality in varying ways for each particular application. Various components and blocks may be arranged differently (e.g., arranged in a different order, or partitioned in a different way) all without departing from the scope of the subject technology.

As used herein, the phrase "at least one of" preceding a series of items, with the term "and" or "or" to separate any of the items, modifies the list as a whole, rather than each member of the list (i.e., each item). The phrase "at least one of" does not require selection of at least one of each item listed; rather, the phrase allows a meaning that includes at least one of any one of the items, and/or at least one of any combination of the items, and/or at least one of each of the items. By way of example, the phrases "at least one of A, B, and C" or "at least one of A, B, or C" each refer to only A, only B, or only C; any combination of A, B, and C; and/or at least one of each of A, B, and C.

Phrases such as an aspect, the aspect, another aspect, some aspects, one or more aspects, an implementation, the implementation, another implementation, some implementations, one or more implementations, an embodiment, the embodiment, another embodiment, some embodiments, one or more embodiments, a configuration, the configuration, another configuration, some configurations, one or more configurations, the subject technology, the disclosure, the present disclosure, other variations thereof and alike are for convenience and do not imply that a disclosure relating to such phrase(s) is essential to the subject technology or that such disclosure applies to all configurations of the subject technology. A disclosure relating to such phrase(s) may apply to all configurations, or one or more configurations. A disclosure relating to such phrase(s) may provide one or more examples. A phrase such as an aspect or some aspects may refer to one or more aspects and vice versa, and this applies similarly to other foregoing phrases.

The word "exemplary" is used herein to mean "serving as an example, instance, or illustration." Any embodiment described herein as "exemplary" or as an "example" is not necessarily to be construed as preferred or advantageous over other embodiments. Furthermore, to the extent that the term "include," "have," or the like is used in the description or the claims, such term is intended to be inclusive in a manner similar to the term "comprise" as "comprise" is interpreted when employed as a transitional word in a claim.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "step for."

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the subject disclosure.

What is claimed is:

1. A device comprising:
   a front-end circuit of a wireless communication circuit capable of being coupled to a radio-frequency (RF) receiving external medium;
   an overvoltage protection circuit; and
   a protection switch coupled to the overvoltage protection circuit and operable to decouple the front-end circuit from the RF receiving external medium so as to prevent an overvoltage from reaching the front-end circuit from the RF receiving external medium, in response to a switch signal,
   wherein the overvoltage protection circuit is configured to detect an overvoltage event at one or more nodes of a circuit, and in response to the detection of an overvoltage event, generate the switch signal to activate the protection switch.

2. The device of claim 1, wherein the one or more nodes of the circuit comprise an output node of the front-end circuit, and wherein the overvoltage protection circuit is digitally controllable.

3. The device of claim 1, further comprising a digital control circuit configured to generate and communicate one or more protect signals to the overvoltage protection circuit, and wherein the one or more protect signals comprise a switch-set signal and a switch-reset signal.

4. The device of claim 1, wherein the overvoltage protection circuit is further configured to issue a switch status signal, wherein the switch status signal is receivable by a digital control circuit.

5. The device of claim 4, wherein the digital control circuit is further configured to communicate with a control system, and wherein the control system comprises one of a processor or a digital core.

6. The device of claim 5, wherein communications with the control system comprises information requests, information deliveries, sending protect status signals, and receiving at least one of a protect-set signal, a protect reset signal, a configuration signal, or a control signal.

7. The device of claim 1, wherein the overvoltage protection circuit comprises one or more comparator circuits and a latch circuit, and wherein each comparator circuit is configured to compare one or more node voltages of the one or more nodes of the circuit with a reference voltage to detect the overvoltage event.

8. The device of claim 1, wherein the switch signal is asserted for a predefined number of clock cycles, and wherein the overvoltage protection circuit is configured to notify a control system after a predefined number of assertions of the switch signal.

9. The device of claim 1, wherein the overvoltage protection circuit is further configured to send a gain control signal to the front-end circuit to set a gain of front-end circuit to a desired value in response to the switch signal.

10. A method comprising:
   detecting an overvoltage event at one or more nodes of a circuit of a wireless communication circuit;
   generating, in response to the detection of the overvoltage event, a switch signal; and
   decoupling the circuit from a radio-frequency (RF) receiving external medium via a switch, in response to the switch signal,
   wherein the circuit is capable of being coupled to the RF receiving external medium via the switch, and wherein decoupling prevents an overvoltage to reach a front-end circuit of a wireless communication circuit from the RF receiving external medium.

11. The method of claim 10, wherein detecting the overvoltage event comprises detecting the overvoltage event at an output node of the front-end circuit.

12. The method of claim 10, further comprising configuring a digital control circuit to generate one or more protect signals, and configuring an overvoltage protection circuit to receive the one or more protect signals, wherein the one or more protect signals comprise a switch-set signal and a switch-reset signal.

13. The method of claim 12, wherein the overvoltage protection circuit comprises one or more comparator circuits and a latch circuit, and wherein the method comprises configuring each comparator circuit to compare one or more node voltages of the one or more nodes of the circuit with a reference voltage to detect the overvoltage event.

14. The method of claim 12, further comprising configuring the overvoltage protection circuit to issue a switch status signal, and wherein the switch status signal is issued to the digital control circuit.

15. The method of claim 14, further comprising configuring the digital control circuit to communicate with a control system, and wherein the control system comprises one of a processor or a digital core.

16. The method of claim 15, wherein communicating with the control system comprises communicating information requests and information deliveries, sending protect status signals, and receiving at least one of a protect-set signal, a protect reset signal, a configuration signal, or a control signal.

17. The method of claim 10, further comprising asserting the switch signal for a predefined number of clock cycles and notifying a control system after a predefined number of assertions of the switch signal.

18. The method of claim 10, further comprising sending a gain control signal to the front-end circuit to set a gain of the front-end circuit to a desired value in response to the switch signal.

19. A communication apparatus comprising:
   a circuit capable of being coupled to a radio-frequency (RF) receiving external medium; and
   a digital protection circuit comprising:
   an overvoltage protection circuit; and
   a protection switch coupled to the overvoltage protection circuit and operable to decouple the circuit from the RF receiving external medium so as to prevent an overvoltage from reaching a front-end circuit from the RF receiving external medium, in response to a switch signal,
   wherein the overvoltage protection circuit is configured to detect an overvoltage event at one or more nodes of the circuit, and in response to the detection of the overvoltage event, generate the switch signal to activate the protection switch.

20. The communication apparatus of claim 19, wherein the overvoltage protection circuit is further configured to send a gain control signal to the front-end circuit to set a gain of the front-end circuit to a desired value in response to the switch signal, wherein the communication apparatus comprises a digital control circuit that is configured to generate and communicate one or more protect signals to the overvoltage protection circuit, wherein the one or more protect signals comprise a switch-set signal and a switch-reset signal.

* * * * *

UNITED STATES PATENT AND TRADEMARK OFFICE
CERTIFICATE OF CORRECTION

PATENT NO. : 9,543,752 B2
APPLICATION NO. : 14/042436
DATED : January 10, 2017
INVENTOR(S) : Jan Roelof Westra et al.

Page 1 of 1

It is certified that error appears in the above-identified patent and that said Letters Patent is hereby corrected as shown below:

In the Claims

Column 10, Claim 10, Line 31, "a wireless communication circuit" should be --a wireless communication device--.

Signed and Sealed this
Tenth Day of September, 2019

Andrei Iancu
*Director of the United States Patent and Trademark Office*